United States Patent
Wu et al.

(10) Patent No.: US 11,551,772 B2
(45) Date of Patent: Jan. 10, 2023

(54) PERFORMING A DECODING OPERATION TO SIMULATE SWITCHING A BIT OF AN IDENTIFIED SET OF BITS OF A DATA BLOCK

(71) Applicant: Micron Technology, Inc., Boise, ID (US)

(72) Inventors: Yingquan Wu, Palo Alto, CA (US); Eyal En Gad, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/248,726

(22) Filed: Feb. 4, 2021

(65) Prior Publication Data

US 2021/0159922 A1 May 27, 2021

Related U.S. Application Data

(62) Division of application No. 15/900,562, filed on Feb. 20, 2018, now Pat. No. 10,951,239.

(51) Int. Cl.
*G11C 29/04* (2006.01)
*H03M 13/37* (2006.01)
(Continued)

(52) U.S. Cl.
CPC .......... *G11C 29/04* (2013.01); *G06F 11/1012* (2013.01); *G06F 11/1068* (2013.01);
(Continued)

(58) Field of Classification Search
CPC . G11C 29/04; G11C 29/52; G11C 2029/0409; G11C 2029/0411; G06F 11/1012; G06F 11/1068; G06F 11/0766; H03M 13/3707; H03M 13/3738; H03M 13/2912; H03M 13/2927; H03M 13/2948; H03M 13/152
See application file for complete search history.

(56) References Cited

U.S. PATENT DOCUMENTS 4,881,232 A    11/1989   Sako et al.
5,828,673 A *   10/1998   Mikawa ................. H01L 22/22
                                               714/718
(Continued)

OTHER PUBLICATIONS

International Search Report and Written Opinion for International Application No. PCT/US2019/018823, dated May 29, 2019, 12 pages.
(Continued)

*Primary Examiner* — Steve N Nguyen
(74) *Attorney, Agent, or Firm* — Lowenstein Sandler LLP

(57) ABSTRACT

A set of bits of a segment of a memory device that is associated with an unsuccessful first decoding operation can be identified. A discrepancy value for at least one bit of the set of bits can be calculated. It can be determined whether the discrepancy value calculated for the at least one bit of the set of bits corresponds to a correction capability of the failed decoding operation. In response to determining that the discrepancy value calculated for the at least one bit corresponds to the correction capability of the failed decoding operation, the at least one bit of the set of bits can be corrected by switching a value of the at least one bit.

20 Claims, 7 Drawing Sheets

(51) Int. Cl.
  *G11C 29/52* (2006.01)
  *G06F 11/10* (2006.01)
  *G06F 11/07* (2006.01)
(52) U.S. Cl.
  CPC ......... *G11C 29/52* (2013.01); *H03M 13/3707* (2013.01); *H03M 13/3738* (2013.01); *G06F 11/0766* (2013.01)

(56) References Cited

U.S. PATENT DOCUMENTS

| | | | | |
|---|---|---|---|---|
| 7,562,282 | B1* | 7/2009 | Rothberg | G11B 20/1833 |
| | | | | 714/54 |
| 8,458,536 | B2 | 6/2013 | Yang | |
| 10,511,334 | B2* | 12/2019 | Kim | H03M 13/2948 |
| 11,057,060 | B1* | 7/2021 | Luo | H03M 13/616 |
| 2007/0150791 | A1* | 6/2007 | Gross | G06F 11/1044 |
| | | | | 714/763 |
| 2009/0183053 | A1* | 7/2009 | Ito | G06F 11/106 |
| | | | | 714/764 |
| 2010/0017684 | A1 | 1/2010 | Yang | |
| 2010/0169746 | A1* | 7/2010 | Karabed | G11B 20/18 |
| | | | | 714/780 |
| 2011/0214029 | A1 | 9/2011 | Steiner et al. | |
| 2012/0005560 | A1 | 1/2012 | Steiner et al. | |
| 2014/0325320 | A1* | 10/2014 | Subramanian | H03M 13/152 |
| | | | | 714/782 |
| 2016/0253227 | A1* | 9/2016 | Chen | G06F 11/1012 |
| | | | | 714/758 |
| 2017/0004036 | A1 | 1/2017 | Ha et al. | |
| 2017/0093433 | A1* | 3/2017 | Ilani | H03M 13/159 |
| 2017/0093439 | A1 | 3/2017 | Motwani | |
| 2017/0257121 | A1 | 9/2017 | Kwok | |
| 2017/0279467 | A1 | 9/2017 | Bhatia et al. | |
| 2017/0279468 | A1 | 9/2017 | Kumar et al. | |
| 2017/0371744 | A1 | 12/2017 | Sehgal et al. | |
| 2018/0167088 | A1* | 6/2018 | Vakilinia | H03M 13/2945 |

OTHER PUBLICATIONS

J. Jung and I. Park, "Multi-Bit-Flipping Decoding of LDPC Codes for NAND Storage Systems", in IEEE Communication Letters, vol. 21, No. 5, pp. 979-982, May 2017.

* cited by examiner

PERFORMING A DECODING OPERATION TO SIMULATE SWITCHING A BIT OF AN IDENTIFIED SET OF BITS OF A DATA BLOCK

RELATED APPLICATION

This application is a divisional of U.S. patent application Ser. No. 15/900,562, filed Feb. 20, 2018, which is hereby incorporated in its entirety herein by reference.

TECHNICAL FILED

The present disclosure generally relates to a storage system, and more specifically, relates to performing a decoding operation to simulate switching a bit on an identified set of bits of a data block.

BACKGROUND

A storage system may include one or more memory components that store data. For example, a solid-state drive (SSD) may include memory devices such as non-volatile memory devices. The SSD may further include an SSD controller that may manage each of the memory devices and allocate data to be stored at the memory devices. A host system may utilize the SSD and request data from the SSD. The SSD controller may be used to retrieve data from the corresponding memory devices and return the retrieved data to the host system.

BRIEF DESCRIPTION OF THE DRAWINGS

The present disclosure will be understood more fully from the detailed description given below and from the accompanying drawings of various implementations of the disclosure.

FIG. 6A illustrates an example of identifying a first bit of a set of bits of a data block for the second decoding operation in accordance with some embodiments of the present disclosure.

FIG. 6B illustrates an example of identifying a second bit of a set of bits of a data block for the second decoding operation in accordance with some embodiments of the present disclosure.

FIG. 6C illustrates an example of correcting the second bit of a set of bits of a data block by the second decoding operation in accordance with some embodiments of the present disclosure.

DETAILED DESCRIPTION

Figure 1:
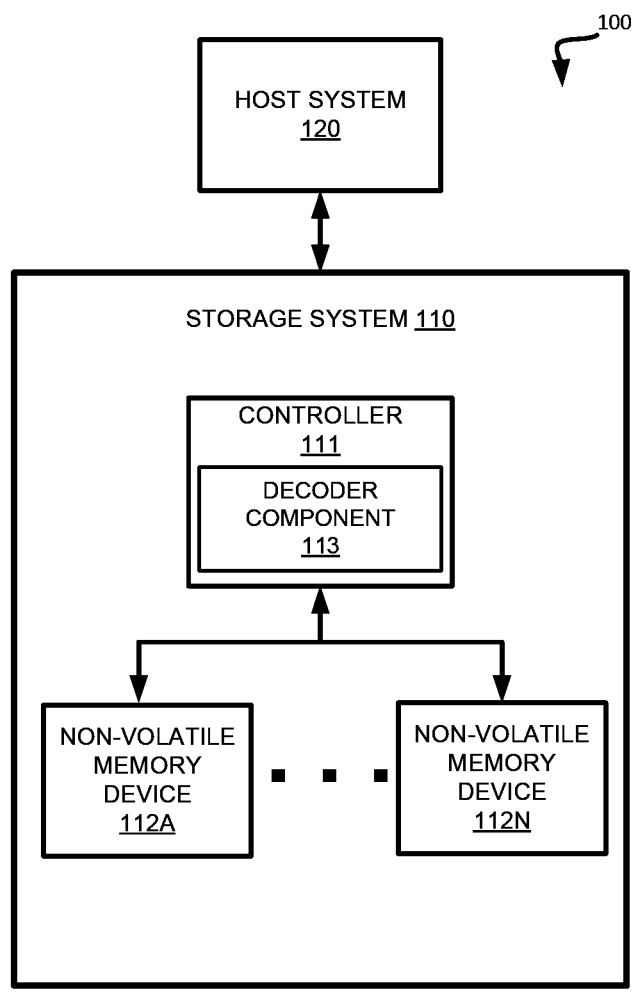
FIG. 1 illustrates an example computing environment that includes a storage system in accordance with some embodiments of the present disclosure.

Aspects of the present disclosure are directed to performing a decoding operation to simulate switching a bit on an identified set of bits of a data block. In general, a host system may utilize a storage system that includes one or more memory devices. The host system may provide data to be stored at the storage system and may subsequently retrieve data stored at the storage system. The data may be stored and retrieved from the memory devices within the storage system.

An example of a storage system is a solid-state drive (SSD) that includes non-volatile memory and a controller to manage the non-volatile memory. The controller may encode data into a format for storage at the storage system and may subsequently decode the encoded data when retrieving the corresponding data from the storage system. Such encoding and decoding operations may correspond to an error correction code (ECC) process that is used to correct errors when retrieving the corresponding data that has been stored at the storage system. For example, a number of bits of the decoded data stored at the storage system and received by the controller may have been inadvertently changed (e.g., flipped due to noise, interference, distortion, or bit synchronization errors). Specifically, a bit that may have originally been stored at a value of '0' may be changed to a value of I' or vice versa. The encoding and decoding operations of the ECC process may be used to identify whether a particular bit has been switched and may subsequently change the value of the bit when returning the corresponding data.

As an example, block-wise product Bose-Chaudhuri-Hocquenghem (BWP-BCH) codes may be used to encode the data. In BWP-BCH codes, a data block may be arranged in a two-dimensional array of rows and columns. Each row and column of the two-dimensional array may be encoded with an error-correcting code, such as a binary BCH code. The intersections between a row and a column may be an entry of the array. Each entry of the array may include a set of bits of data. The controller may then decode the encoded data into the original sequence of characters (also referred to as "codewords" hereafter) that were encoded on the storage system. Codewords corresponding to encoded data stored on the storage system that are corrupted with errors may be transmitted from the storage system to the controller during a decoding operation.

BWP codes may be decoded using an iterative process. For example, each row of the two-dimensional array may be decoded to produce a corresponding codeword. Then, each column of the two-dimensional array may be decoded to produce a corresponding codeword. Decoding of BWP-BCH codes may be performed using hard decoding where the controller receives a binary channel output for each bit in the codeword.

The error-correcting code that is encoded with each row and column of the two-dimensional array may correct a number of errors in the error-correcting code's corresponding row or column that is less than or equal to the error-correcting code's correction capability. However, if the number of errors in the corresponding row or column is greater than the error-correcting code's correction capability, then the error-correcting code may not be able to correct the errors of the corresponding row or column, resulting in an unsuccessful correction of errors (also referred to as "unsuccessful decoding operation" hereafter). For example, if an error-correcting code has a correction capability of 4 errors and a row and/or column of the data block contains 4 errors, then the error-correcting code may correct the 4 errors of the row and/or column. However, if the error-correcting code has a correction capability of 4 errors and a row and/or column of the array contains 5 errors, then the error-correcting code may not be able to correct the errors of the row and/or column, resulting in an unsuccessful decoding operation. The correction capability of the error-correcting code may be proportional to a data size of the error-correcting code. For example, an error-correcting code having a correction capability of 3 errors may have a smaller data size than an error-correcting code having a correction capability of 4 errors.

Aspects of the present disclosure address the above and other deficiencies by performing a subsequent decoding operation to simulate switching a bit on an identified set of bits of a data block. For example, the controller of the storage system may perform a first decoding operation on an identified data block. The first decoding operation may correct errors in rows and columns having a number of errors less than or equal to the correction capability of the first decoding operation. If any of the rows or columns of the data block contain more errors than the correction capability of the first decoding operation, then the decoding of those rows or columns may result in an unsuccessful correction of the errors. The controller may then identify any sets of bits of the data block that caused the unsuccessful correction of the errors. The unsuccessful correction of errors of any of the sets of bits of the data block may trigger the initiation of a second decoding operation. The second decoding operation may have a correction capability of at least one integer greater than the first decoding operation. For example, if the first decoding operation has a correction capability of 4, then the second decoding operation may have a correction capability of 5. In some implementations, the subsequent decoding operation may produce a list of possible codewords based on the correction of errors of a set of bits.

The second decoding operation may have a correction capability of at least one integer greater than the first decoding operation by simulating switching at least one bit of the set of bits and determining whether the switched bit is an error. For example, if a set of bits of the data block contains 10 bits, then the second decoding operation may simulate switching at least one bit of the 10 bits to determine if the switched bit is an error. In some implementations, the second decoding operation may be performed iteratively on each bit of the set of bits to identify errors in the set of bits. For example, the second decoding operation may simulate switching the first bit of the set of bits to determine if the first bit is an error, then proceed with simulating switching the second bit, then simulating switching the third bit and so on. The second decoding operation may then correct the bits that are identified as errors by switching the value of those particular bits from a 0 to a 1 or vice versa.

Thus, utilizing a second decoding operation may allow for correcting a greater number of errors during the decoding of the storage system by initiating the second decoding operation when the first decoding operation is associated with the unsuccessful correction of errors. The second decoding operation may also increase decoding accuracy, resulting in a higher chance of a successful decoding operation and reducing the amount of power usage and time dedicated to decoding operations. Furthermore, the second decoding operation may allow for the decoding of a greater number of errors without increasing the data size of the error-correcting code encoded with each row and column of the data block of the storage system as the second decoding operation may utilize the same error-correcting code as the first decoding operation. As a result, the performance of the controller may be improved by allowing for correcting a greater number of errors during the decoding of data without increasing the data size of the error-correcting code. Although the present disclosure describes correcting errors in a decoding operation of data being stored on a storage system, aspects of the present disclosure may be applied to any instance of error-correcting of a signal.

FIG. 1 illustrates an example computing environment 100 that includes a storage system 110. In general, the computing environment 100 may include a host system 120 that uses the storage system 110. For example, the host system 120 may write data to the storage system 110 and read data from the storage system 110.

The host system 120 may be a computing device such as a desktop computer, laptop computer, network server, mobile device, or such computing device that includes a memory and a processing device. The host system 120 may include or be coupled to the storage system 110 so that the host system 120 may read data from or write data to the storage system 110. For example, the host system 120 may be coupled to the storage system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface may be used to transmit data between the host system 120 and the storage system 110. The host system 120 may further utilize an NVM Express (NVMe) interface to access the memory devices 112A to 112N when the storage system 110 is coupled with the host system 120 by the PCIe interface.

As shown in FIG. 1, the storage system 110 may include a controller 111 and memory devices 112A to 112N. In some embodiments, the memory devices 112A to 112N may be based on non-volatile memory. For example, the memory devices 112A to 112N may be a negative-and (NAND) type flash memory. Each of the memory devices 112A to 112N may include one or more arrays of memory cells such as single level cells (SLCs) or multi-level cells (MLCs) (e.g., triple level cells (TLCs) or quad-level cells (QLCs)). In some embodiments, a particular memory device may include both SLC memory cells and MLC memory cells. Each of the memory cells may store one or more bits of data (e.g., data blocks) used by the host system 120. Although non-volatile memory devices such as NAND type flash memory are described, the memory devices 112A to 112N may be based on any other type of non-volatile memory or volatile memory. For example, the memory devices 112A to 112N may be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. The memory devices 112A to 112N may include any combination of the different types of non-volatile memory or volatile memory. Furthermore, the memory cells of the memory devices 112A to 112N may be grouped as memory pages or data blocks that may refer to a unit of the memory device used to store data.

The controller 111 may communicate with the memory devices 112A to 112N to perform operations such as reading data, writing data, or erasing data at the memory devices 112A to 112N and other such operations. Furthermore, the controller 111 may include hardware such as one or more integrated circuits and/or discrete components, a processing device, a buffer memory, software such as firmware or other instructions, or a combination thereof. In general, the controller 111 may receive commands or operations from the host system 120 and may convert the commands or operations into instructions or appropriate commands to achieve the desired access to the memory devices 112A to 112N. The controller 111 may be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 111 may further include host interface circuitry to communicate with the host system 120 via the physical host interface. The host interface circuitry may convert the commands received from the host system into command instructions to access the memory devices 112A to 112N as well as convert responses associated with the memory devices 112A to 112N into information for the host system 120.

Referring to FIG. 1, the controller 111 may include a decoder component 113 that may be used to decode data stored on memory devices 112A to 112N by using different types of decoding operations. For example, the decoder component 113 may perform a first decoding operation on an identified data block. The decoder component 113 may correct a first number of errors during the first decoding operation that correspond to a correction capability of the first decoding operation. For example, if a data block contains 4 errors and the correction capability of the first decoding operation is 4, then the decoder component 113 may correct the 4 errors during the first decoding operation. The decoder component 113 may also identify a set of bits of the data block that include a second number of errors that is greater than the correction capability of the first decoding operation. For example, if the first decoding operation has a correction capability of 4 errors and a set of bits of the data block contains 5 errors, then the decoder component 113 may identify the set of bits as having a number of errors greater than the correction capability of the first decoding operation. The decoder component 113 may then perform a second decoding operation on the set of bits. Further details with regards to the operations of the decoder component 113 are described below. Although aspects of the present disclosure describe the second decoding operation being performed subsequent to a first decoding operation, in implementations any number of decoding operations may be performed. For example, a first decoding operation having a correction capability of 4 may be performed, followed by a second decoding operation having a correction capability of 5, followed by a third decoding operation having a correction capability of 6.

The storage system 110 may include additional circuitry or components that are not illustrated. For example, the storage system 110 may include a cache or buffer (e.g., DRAM) and address circuitry (e.g., a row decoder and a column decoder) that may receive an address from the controller 111 and decode the address to access the memory devices 112A to 112N.

Figure 2A:
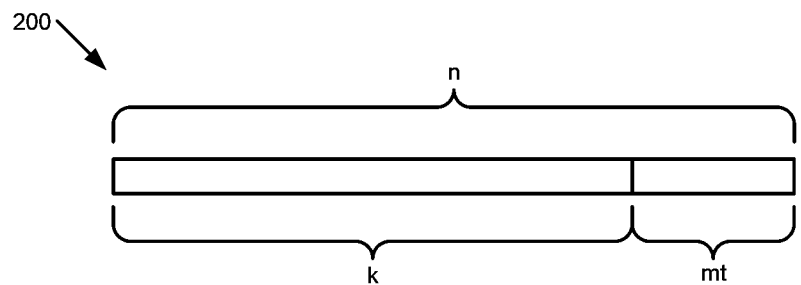
FIG. 2A illustrates an example of a data block of a storage system in accordance with some embodiments of the present disclosure.

FIG. 2A illustrates an example of a data block 200 of a storage system. In some implementations, data block 200 may be decoded by decoder component 113 of FIG. 1.

Data block 200 may be representative of user data stored on a storage system. Data block 200 may include user data (k) of a particular size that has been encoded and stored on the storage system. For example, the user data may have a data size of 6400 bits. Data block 200 may also include error-correcting code (mt) that also has a particular size, where m corresponds to the floor (e.g., the smallest integer larger than) of a binary logarithm of n. For example, error-correcting code may have a data size of 600 bits. The error-correcting code may have a correction capability (t) that indicates the number of errors the error-correcting code is able to correct during a first decoding operation. As previously discussed, the data size of the error-correcting code may correspond to the correction capability of the error-correcting code. For example, an error-correcting code having a correction capability of t=4 may have a larger data size than an error-correcting code having a correction capability of t=3. Data block 200 may have a total block size (n) that is the total of both the user data (k) and the error-correcting code (mt). For example, if the user data has a size of 6400 bits and the error-correcting code has a size of 600 bits, then the data block 200 may have a total block size of 7000 bits.

Figure 2B:
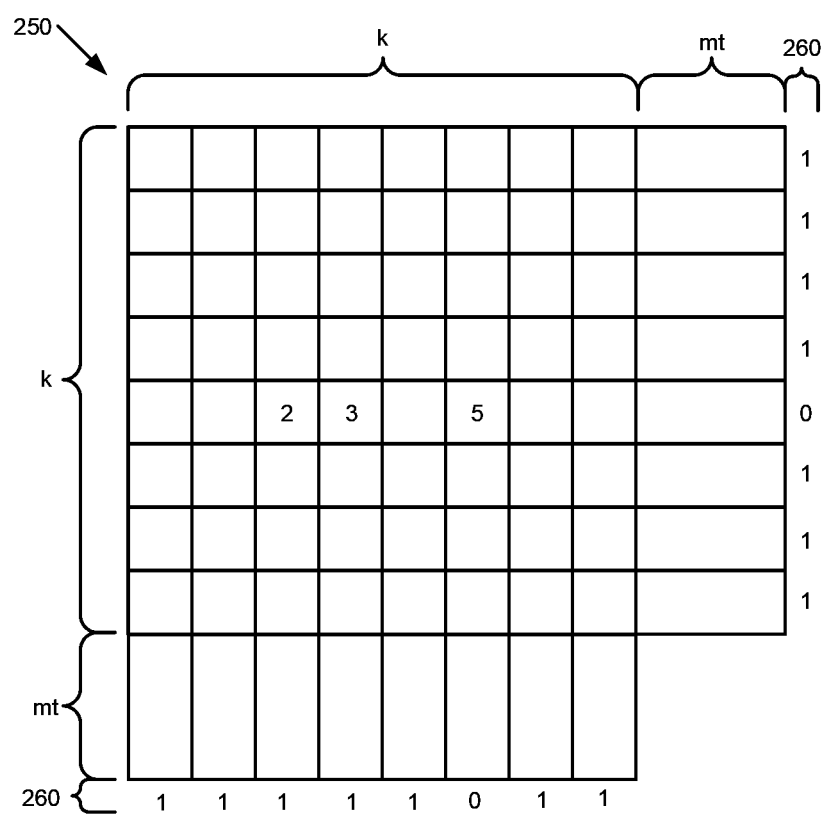
FIG. 2B illustrates an example of identifying a set of bits of a data block that are associated with an unsuccessful correction of an error in accordance with some embodiments of the present disclosure.

FIG. 2B illustrates an example of identifying a set of bits of a data block 250 that are associated with an unsuccessful correction of an error. In some implementations, the set of bits may be identified by decoder component 113 of FIG. 1.

The data block 250 may include user data (k) of data block 200. However, rather than being encoded as a single string of bits of data, as illustrated in FIG. 2A, the user data (k) may be encoded into an array of rows and columns, as illustrated in FIG. 2B. For example, if the user data has a data size of 6400 bits, then the 6400 bits may be encoded into data block 250 having 8 rows and 8 columns each being 80 bits, as illustrated in FIG. 2B. Although data block 250 may be illustrated as having an equal number of rows and columns, in other implementations data block 250 may contain various geometries formed of differing numbers of rows and columns.

Each row and column of data block 250 may be encoded with a corresponding error-correcting code (mt), as previously discussed. Furthermore, each row and column may be divided into sets of bits, illustrated as boxes in FIG. 2B. Using the previous example, a row consisting of 800 bits may be divided into 8 sets of bits, where each set of bits includes 10 bits. The error-correcting code may have a correction capability (t) that corresponds to a number of errors the error-correcting code may be able to correct in the error-correcting code's corresponding row or column during a decoding operation. For example, if an error-correcting code for a row has a correction capability of t=4, then the error-correcting code may correct up to 4 errors in that row.

During a decoding operation, the processing device may store status bits 260 that correspond to whether that particular row or column has at least one set of bits that are associated with an unsuccessful correction of an error. For example, if a row or column of data block 250 does not have any sets of bits that caused an unsuccessful correction of an error, then the processing device may set a status bit 260 that corresponds to that particular row or column to read a value of 1. Conversely, if a row or column of data block 250 has at least one set of bits that caused an unsuccessful correction of an error, then the processing device may set a status bit 260 that corresponds to that particular row or column to read a value of 0.

During the decoding operation, the processing device may iteratively decode the rows and columns of data block 250. For example, the processing device may first decode all the rows of the array followed by all the columns of the array, or vice versa. During the decoding operation, some sets of bits may include a number of errors. In the present illustration, data block 350 includes 3 sets of bits that contain a number of errors. One set of bits contains 2 errors, one set of bits includes 3 errors and another set of bits includes 5 errors. In the present illustration, the error-correcting code may have a correction capability of t=4. As each row of the data block 250 is decoded, the processing device may store the status bit as a 1, which indicates that none of the sets of bits for that row are associated with an unsuccessful decoding operation. During the decoding operation the processing device may begin decoding the fifth row from the top of the array that includes the set of bits containing 2 errors, the set of bits containing 3 errors and the set of bits containing 5 errors, resulting in a total number of errors for the row equaling 10. Because the total number of errors for the row is greater than the correction capability (e.g., t=4) of the error-correcting code, the row may cause an unsuccessful correction of an error. Accordingly, the processing device may store the status bit for the row as a 0, indicating that at least one of the sets of bits in the row caused an unsuccessful correction of an error.

Following the decoding of the rows of the array, the processing device may decode each of the columns of the array of data block 250. During the decoding operation the processing device may decode the third column from the left of the array that includes the set of bits containing 2 errors. Because the total number of errors (e.g., 2) is less than the correction capability of the column's error-correcting code (e.g., 4) the decoding operation may successfully correct the 2 errors in the set of bits. After successful correction of the 2 errors in the set of bits, the processing device may store the status bit for the column as a 1, indicating that no sets of bits in the column caused an unsuccessful correction of an error. Similarly, when the processing device decodes the fourth column from the left of the array it may correct the 3 errors in the set of bits and store the status bit for the fourth column as a value of 1. However, the sixth column from the left of the array contains 5 errors. Because the total number of errors (e.g., 5 bits) is greater than the correction capability of the column's error-correcting code (e.g., 4) the set of bits containing 5 errors may cause an unsuccessful correction of an error. Accordingly, the processing device may store the status bit for the sixth column as a 0 to indicate an unsuccessful correction of an error.

Figure 3:
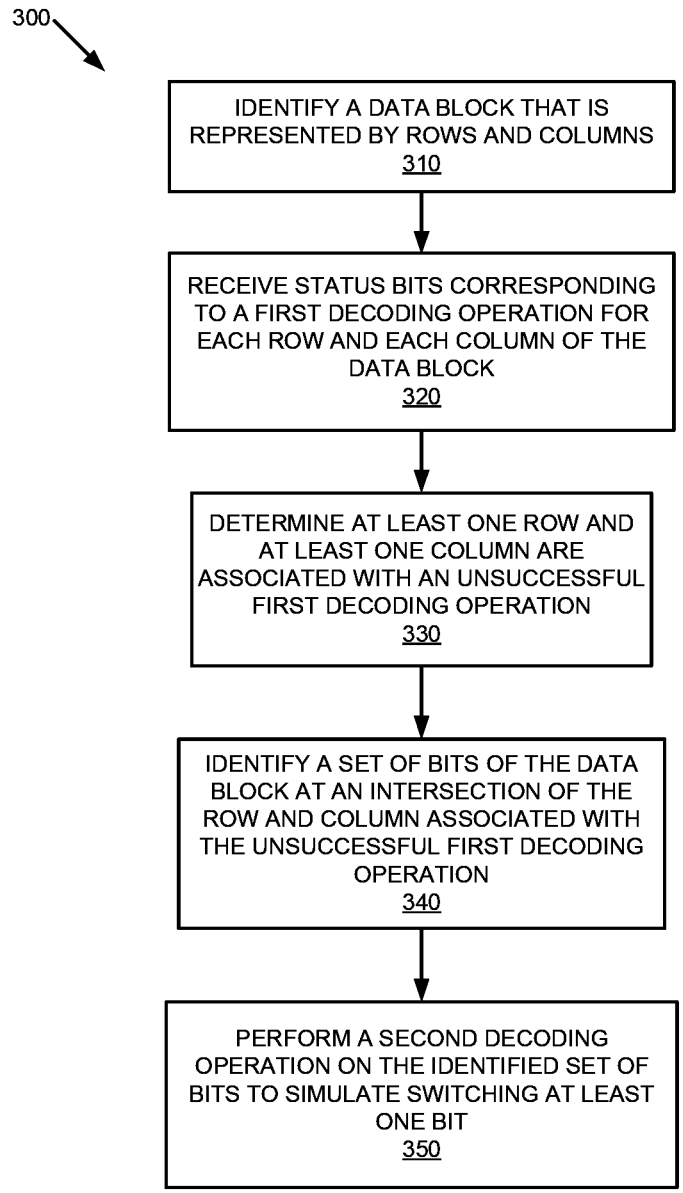
FIG. 3 is a flow diagram of an example method to perform a second decoding operation on an identified set of bits at an intersection of a row and column of the data block that are associated with an unsuccessful first decoding operation in accordance with some embodiments of the present disclosure.

FIG. 3 is a flow diagram of an example method 300 to perform a second decoding operation on an identified set of bits at an intersection of a row and column of the data block that are associated with an unsuccessful first decoding operation, in accordance with an embodiment of the present disclosure. The method 300 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 may be performed by the decoder component 113 of FIG. 1.

Method 300 may begin by the processing device identifying a data block that is represented by rows and columns (block 310). For example, the processing device may identify a two-dimensional array of data encoded on a storage system, such as the array discussed at FIG. 2B. The processing device may then receive status bits corresponding to a first decoding operation for each row and each column of the two-dimensional array of the data block (block 320). The status bits may correspond to whether the rows and/or columns are associated with an unsuccessful first decoding operation. For example, if a row is associated with an unsuccessful first decoding operation, then the status bit may have a value of 0. However, if the row is associated with a successful first decoding operation, then the status bit may have a value of 1. In some implementations, the row and/or column may be associated with an unsuccessful first decoding operation when a number of errors for a particular row and/or column is greater than the correction capability of the error-correcting code for that particular row and/or column. The processing device may then determine at least one row and at least one column of the two-dimensional array are associated with an unsuccessful first decoding operation based on the status bits (block 330). For example, the processing device may identify that a row is associated with an unsuccessful first decoding operation if the row's corresponding status bit has a value of 0. Similarly, the processing device may identify that a column is associated with an unsuccessful first decoding operation if the column's corresponding status bit has a value of 0. In some implementations, each status bit may correspond to a syndrome value used in aspects of the present disclosure, where the status bit may indicate whether the syndrome value is 0. For example, if a row has a status bit with a value of 1, then the syndrome value for the row may have a value of 0.

Subsequently, the processing device may identify a set of bits of the data block that are at an intersection of the row and column that are associated with the unsuccessful first decoding operation (block 340). For example, referring back to FIG. 2B, the processing device may identify the set of bits containing 5 errors located at the intersection of the row having a status bit value of 0 and the column having a status bit value of 0. In some implementations, more than one set of bits of a data block that are associated with the unsuccessful first decoding operation may be identified. In one implementation, the identified set of bits may correspond to one row and multiple columns of the data block. In another implementation, the identified set of bits may correspond to one column and multiple rows of the data block. Once the set of bits has been identified, the processing device may perform a second decoding operation on the identified set of bits (block 350). The second decoding operation may simulate switching at least one bit of the set of bits, as will be discussed in more detail below.

Figure 4:
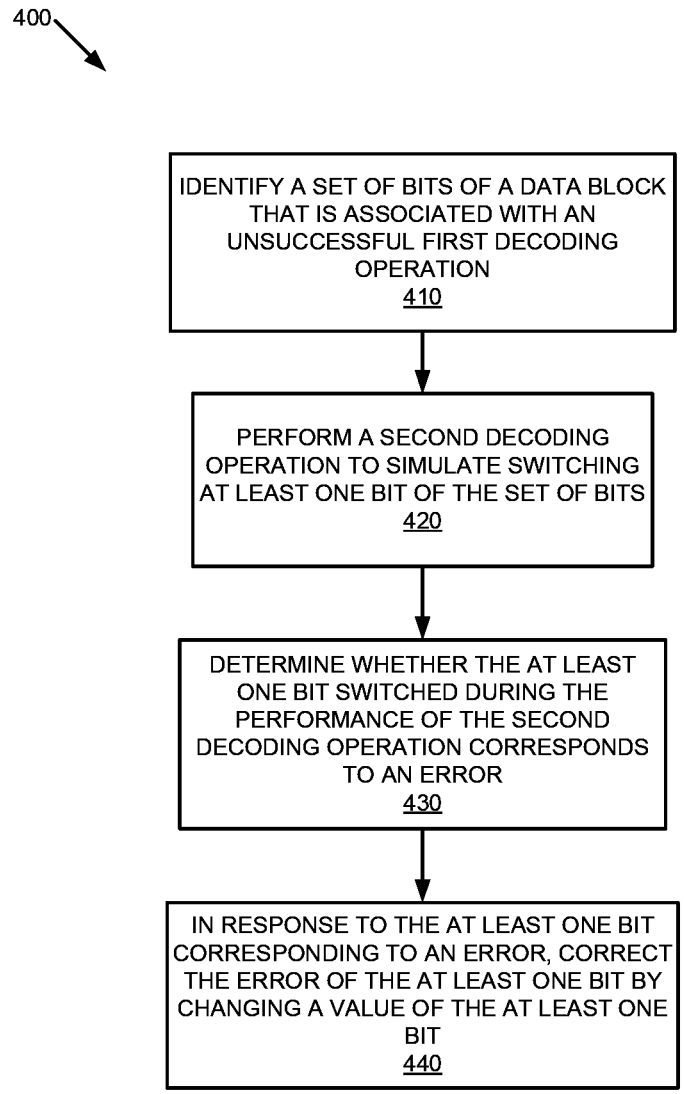
FIG. 4 is a flow diagram of an example method to perform a second decoding operation to simulate switching at least one bit of an identified set of bits in accordance with some embodiments of the present disclosure.

FIG. 4 is a flow diagram of an example method 400 to perform a second decoding operation to simulate switching at least one bit of an identified set of bits, in accordance with one embodiment of the present disclosure. The method 400 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 may be performed by the decoder component 113 of FIG. 1.

Method 400 may begin by the processing device identifying a set of bits of a data block that is associated with an unsuccessful first decoding operation (block 410). The set of bits may include a particular number of errors that caused the unsuccessful first decoding operation. For example, the identified set of bits may contain 5 errors and the error-correcting code may have a correction capability of 4. The processing device may then perform a second decoding operation to simulate switching at least one bit of the set of bits (block 420). In some implementations, the second decoding operation may iteratively simulate the switching of a bit from the set of bits. For example, if a set of bits contains 10 bits, then the second decoding operation may first simulate switching the value of the first bit and determine whether the first bit is an error. Then, the second decoding operation may switch the value of the second bit, followed by the third bit and so on. In some implementations, the second decoding operation may iteratively simulate switching the values of the individual bits until each of the errors in the set of bits has been identified. For example, if a set of bits contains 10 individual bits and 5 of the bits correspond to errors, then the second decoding operation may not simulate switching any remaining bits once the 5 errors have been identified by the second decoding operation. The second decoding operation may be capable of correcting a number of errors at least one integer greater than the first decoding operation. For example, if the first decoding operation has an error-correcting code with a correction capability of t=4, then the second decoding operation may be capable of correcting 5 errors (e.g., t+1). In one implementation, the second decoding operation may be used subsequent to multiple decoding operations to increase the correction capability. For example, the second decoding operation may be used subsequent to decoding operation A having a correction capability of t=4 and decoding operation B having a correction capability of (t+1)=5. This may result in the second decoding operation having a correction capability of (t+2)=6. The second decoding operation may simulate switching a bit (e.g., changing a value of the bit from a '0' to a '1' or vice versa) and determining the switched bit is an error based on outputs of the first decoding operation. The outputs of the first decoding operation may be determined using the following operations:

---

Input: $S = [S_0, S_1, S_2, \ldots, S_{2t-1}]$
Initialization: $\Lambda^{(0)}(x) = 1$, $\beta^{(-1)}(x) = x$, $L_\Lambda^{(0)} = 0$, $L_\beta^{(-1)} = 1$
For $r = 0, 2, \ldots, 2t - 2$, determine:

$$\Delta^{(r+2)} = \sum_{i=0}^{L_\Lambda^{(r)}} \Lambda_i^{(r)} \cdot S_{r-i}$$

$\Lambda^{(r+2)}(x) = \Lambda^{(r)}(x) - \Delta^{(r+2)} \cdot \beta^{(r-1)}(x)$
If $\Delta^{(r+2)} \neq 0$ and $2L_\Lambda^{(r)} \leq r$, then:
   Set $\beta^{(r-1)}(x) \leftarrow (\Delta^{(r+2)})^{-1} \cdot x^2 \Lambda^{(r)}(x)$
   Set $L_\Lambda^{(r+2)} \leftarrow L_\beta^{(r-1)}$, $L_\beta^{(r+1)} \leftarrow L_\Lambda^{(r)} + 2$
Else
   Set $\beta^{(r+1)}(x) \leftarrow x^2 \beta^{(r-1)}(x)$
   Set $L_\beta^{(r+1)} \leftarrow L_\beta^{(r-1)} + 2$, $L_\Lambda^{(r+2)} \leftarrow L_\Lambda^{(r)}$
Output: $\Lambda(x)$, $\beta(x)$, $L_\Lambda$, $L_\beta$

---

Where S corresponds to the syndrome, $\Lambda$ corresponds to an error locator polynomial, $\beta$ corresponds to a correction polynomial, $L_\Lambda$ and $L_\beta$ correspond to degrees of corresponding polynomials and r corresponds to the iteration numbers.

Using the outputs of the first decoding operation, the processing device may then simulate switching the value of at least one bit of the set of bits to determine if the switched bit corresponds to an error (block 430) using the following operations:

---

Input: $\Lambda(x)$, $\beta(x)$, $L_\Lambda$, $L_\beta$
Evaluate: $\{\Lambda_i\}_{i=0}^{n-1} \leftarrow \{\Lambda(\alpha^{-i})\}_{i=1}^{n-1}, \{\beta_i\}_{i=0}^{n-1} \leftarrow \{\beta(\alpha^{-i})\}_{i=0}^{n-1}$
For $i = 0, 1, 2, \ldots, n - t - 2$, perform:
Initialize $\delta_j = \phi$, $j = 0, 1, 2, \ldots, q - 1$
For $i = 0, 1, 2, \ldots, n - t - 2$, determine:

$$\Delta_j \leftarrow \begin{cases} \dfrac{\beta_i \cdot \Lambda_j + \Lambda_i \cdot \beta_j}{(\alpha^{-2j} - \alpha^{-2i})\beta_j}, & \text{if } \Lambda_i = 0 \vee (\Lambda_i \neq 0 \wedge \beta_i \neq 0 \wedge L_\Lambda \geq L_\beta) \\[6pt] \dfrac{(\alpha^{-2j} - \alpha^{-2i})\Lambda_j}{\beta_i \cdot \alpha^{-2j}\Lambda_j + \alpha^{-2i}\Lambda_i \cdot \beta_j}, & \text{if } \beta_i = 0 \vee (\Lambda_i \neq 0 \wedge \beta_i \neq 0 \wedge L_\Lambda \geq L_\beta - 1) \\[6pt] \dfrac{\beta_i \cdot \Lambda_j + \Lambda_i \cdot \beta_j}{\beta_i \cdot \alpha^{-2j}\Lambda_j + \alpha^{-2i}\Lambda_i \cdot \beta_j}, & \text{otherwise} \end{cases}$$

If $\Lambda_j \neq \infty$, then set $\delta_{\Delta_j} \leftarrow \delta_{\Delta_j} \cup \{j\}$
If $|\delta_{\Delta_j}| = t + 1$, then flip bits on indices in $\delta_{\Delta_j} \cup \{i\}$

---

Where $\delta_i$ corresponds to a set of locations with a discrepancy of i, q corresponds to a field size, i corresponds to a bit location and a corresponds to a primitive field element. In some implementations, $\Delta_j$ corresponds to a discrepancy value for a particular bit that the simulated switching operation is performed on. If the absolute value of $\Delta_j$ is equal to one integer greater than the correction capability of the first decoding operation (e.g., t+1), then the processing device may identify that the particular bit corresponds to an error. For example, if the correction capability of the first decoding operation is 4 (e.g., t=4) and a particular bit has a value of $\Delta_j$ that is equal to 5 (e.g., t+1), then the processing device may identify that the particular bit corresponds to an error. After a particular bit has been identified as an error, the processing device may correct the error by changing the value of the particular bit (block 440). For example, if a particular bit corresponding to an error has a value of 0, then the processing device may change the value to 1 when the data block that includes the set of bits is returned to a host system.

Figure 5:
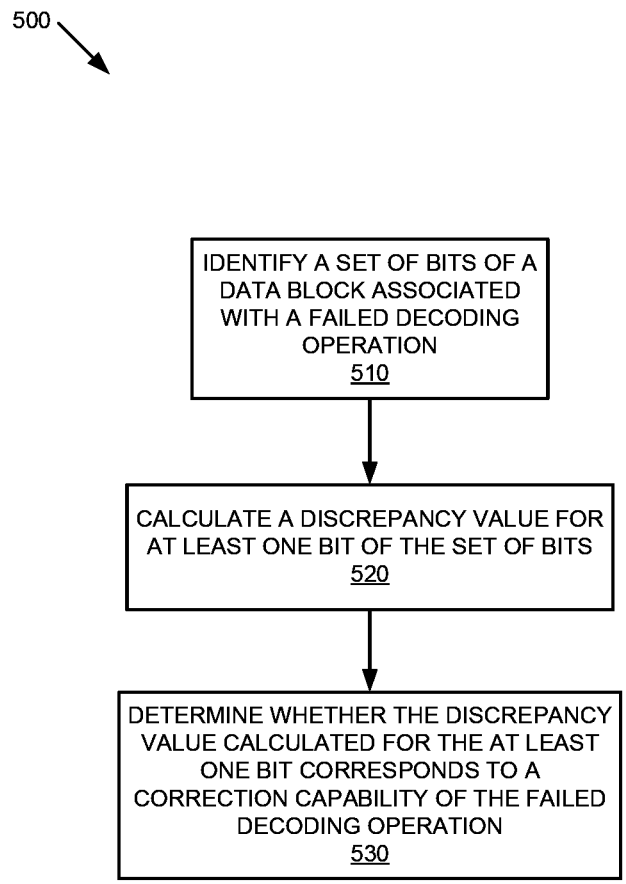
FIG. 5 is a flow diagram of an example method to perform a decoding operation to determine whether a discrepancy value for at least one bit of a set of bits corresponds to a correction capability of a failed decoding operation in accordance with some embodiments of the present disclosure.

FIG. 5 is a flow diagram of an example method 500 to perform a decoding operation to determine whether a discrepancy value for at least one bit of a set of bits corresponds to a correction capability of a failed decoding operation, in accordance with some embodiments of the present disclosure. The method 500 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 may be performed by the decoder component 113 of FIG. 1.

Method 500 may begin with a processing device identifying a set of bits of a data block associated with a failed decoding operation (block 510). In one implementation, the data block may be represented by a two-dimensional array of rows and columns. In some implementations, the processing device may determine that a particular row and a particular column are associated with a failed decoding operation and identify the set of bits at an intersection of the particular row and particular column. For example, referring back to FIG. 2B, the processing device may identify the set of bits containing 5 errors. In implementations, a set of bits associated with a failed decoding operation may correspond to the identified set of bits having a number of errors greater than the correction capability of the failed decoding operation. For example, if the correction capability of the failed decoding operation is 4 and the number of errors of a set of bits is 5 (corresponding to 5 bits), then the set of bits may be associated with a failed decoding operation. In further implementations, the set of bits may be identified based on status bits of the rows and columns of the two-dimensional array, as previously discussed. The processing device may then calculate a discrepancy value for at least one bit of the set of bits (block 520). In one implementation, the calculation of the discrepancy value may be performed inside a loop. In some implementations, the processing device may iteratively determine a respective discrepancy value for each bit of the set of bits. Subsequently, the processing device may determine whether the discrepancy value calculated for the at least one bit of the set of bits corresponds to a correction capability of the failed decoding operation (block 530). For example, if the correction capability of the failed decoding operation is 4 (e.g., t) and the discrepancy value of a particular bit is 5 (e.g., t+1), then the discrepancy value of the particular bit may correspond to the correction capability of the failed decoding operation. In some implementations, in response to determining that the discrepancy value of a particular bit corresponds to the correction capability of the failed decoding operation, the processing device may correct the particular bit by switching the value of the particular bit from a 0 to a 1 or vice versa. In some implementations, after correcting the particular bits of a set of bits the processing device identify a code word associated with the corrected set of bits of the data block.

FIG. 6A illustrates an example of identifying a first bit of a set of bits 600 of a data block for the second decoding operation, in accordance with one embodiment of the present disclosure. In some implementations, the set of bits 600 may be decoded by decoder component 113 of FIG. 1.

The set of bits 600 may include individual bits that each has a corresponding binary value (e.g., a 0 or a 1). In the present illustration, the set of bits 600 may include 10 individual bits. The second decoding operation, as described in FIG. 5, may be performed on the set of bits 600. The second decoding operation may begin by selecting the first bit of the set of bits 600. The second decoding operation may then determine whether the first bit of the set of bits 600 corresponds to an error by simulating the switching of the first bit. In the present illustration, the second decoding operation may determine that the first bit of the set of bits 600 does not correspond to an error.

FIG. 6B illustrates an example of identifying a second bit of a set of bits 600 of a data block for the second decoding operation, in accordance with embodiments of the present disclosure. In some implementations, the set of bits 600 may be decoded by decoder component 113 of FIG. 1.

As previously discussed, the second decoding operation may be an iterative operation. Accordingly, the second decoding operation may then select the second bit of the set of bits 600. The second decoding operation may then determine whether the second bit of the set of bits 600 corresponds to an error by simulating the switching of the second bit. In the present illustration, the decoding operation may determine that the second bit of the set of bits 600 corresponds to an error.

FIG. 6C illustrates an example of correcting the second bit of a set of bits 600 of a data block by the second decoding operation, in accordance with an embodiment of the present disclosure. In some implementations, the set of bits 600 may be decoded by decoder component 113 of FIG. 1.

As previously discussed, the second decoding operation may identify that the second bit of the set of bits 600 corresponds to an error. In response to identifying that the second bit corresponds to an error, the second decoding operation may change the value of the second bit from a 1 to a 0.

Figure 7:
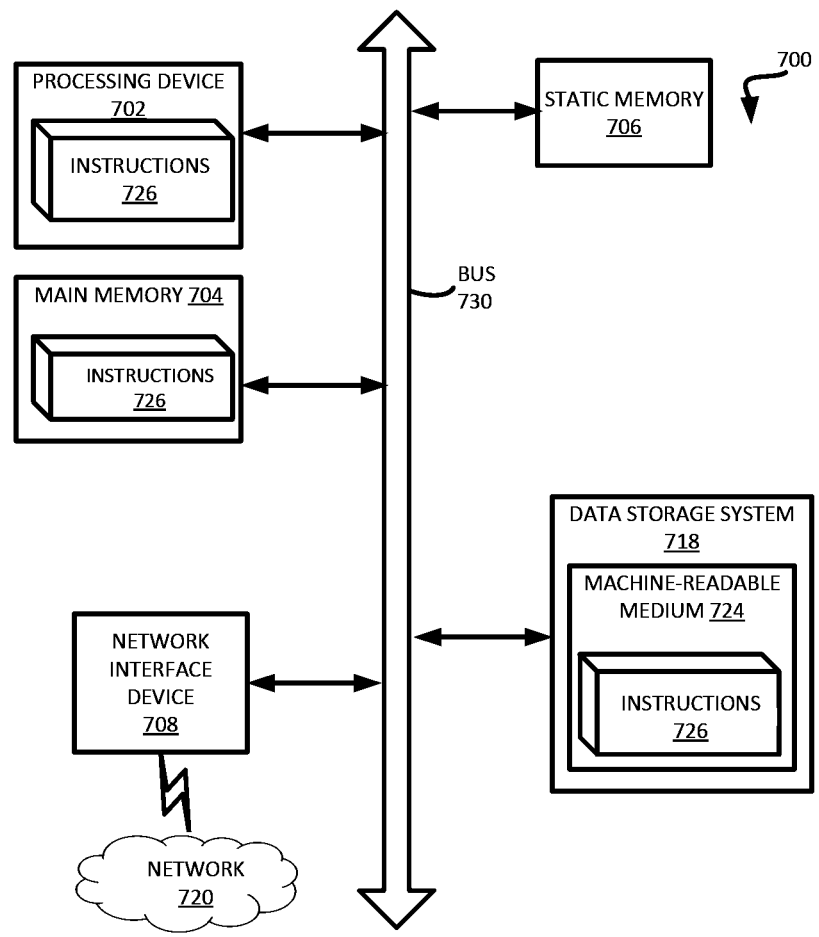
FIG. 7 is a block diagram of an example computer system in which implementations of the present disclosure may operate.

FIG. 7 illustrates an example machine of a computer system 700 within which a set of instructions, for causing the machine to perform any one or more of the methodologies discussed herein, may be executed. For example, the computer system 700 may correspond to a host system (e.g., the host system 120 of FIG. 1) that includes or utilizes a storage system (e.g., the storage system 110 of FIG. 1) or may be used to perform the operations of a controller (e.g., to execute an operating system to perform operations corresponding to the decoder component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730. Processing device 702 represents one or more general-purpose processing devices such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 may further include a network interface device 708 to communicate over the network 720.

The data storage system 718 may include a machine-readable storage medium 724 (also known as a computer-readable medium) on which is stored one or more sets of instructions or software 726 embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 may correspond to the storage system 110 of FIG. 1.

In one implementation, the instructions 726 include instructions to implement functionality corresponding to a decoder component (e.g., decoder component 113 of FIG. 1). While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
      identifying a set of bits of a segment of the memory device associated with a failed decoding operation;
      calculating respective discrepancy values for the set of bits, each respective discrepancy value corresponding to a respective bit of the set of bits;
      determining whether any of the respective discrepancy values for the set of bits corresponds to a correction capability of the failed decoding operation; and
      in response to determining that a subset of the respective discrepancy values corresponds to the correction capability of the failed decoding operation, correcting at least one bit of the set of bits corresponding to the subset of the respective discrepancy values by switching a value of the at least one bit.

2. The system of claim 1, wherein the correction capability corresponds to a number of errors that are correctable by the failed decoding operation.

3. The system of claim 1, wherein the processing device is to perform operations further comprising:
   simulating switching a value of the at least one bit of the set of bits, wherein a respective discrepancy value is calculated for the at least one bit of the set of bits after simulating switching the value of the at least one bit of the set of bits.

4. The system of claim 1, wherein calculating the respective discrepancy values for the set of bits is based on outputs of the failed decoding operation.

5. The system of claim 1, wherein the failed decoding operation corresponds to the set of bits including a number of errors greater than the correction capability of the failed decoding operation.

6. The system of claim 1, wherein the segment of the memory device is represented by a plurality of rows and a plurality of columns in an array of the memory device.

7. The system of claim 6, wherein to identify the set of bits of the segment of the memory device associated with the failed decoding operation, the processing device is to perform operations further comprising:
   determining that at least one row of the plurality of rows is associated with the failed decoding operation; and
   determining that at least one column of the plurality of columns is associated with the failed decoding operation.

8. The system of claim 6, wherein to identify the set of bits of the segment of the memory device associated with the failed decoding operation, the processing device is to perform operations further comprising:
   determining that a first status bit for a respective row of the plurality of rows is associated with the failed decoding operation; and determining that a second status bit for a respective column of the plurality of columns is associated with the failed decoding operation, wherein identifying the set of bits of the segment of the memory device associated with the failed decoding operation is based on determining that the first status bit for the respective row and the second status bit for the respective column are associated with the failed decoding operation.

9. A method comprising:
identifying a set of bits of a segment of a memory device associated with a failed decoding operation;
calculating respective discrepancy values for the set of bits, each respective discrepancy value corresponding to a respective bit of the set of bits;
determining whether any of the respective discrepancy values for the set of bits corresponds to a correction capability of the failed decoding operation; and
in response to determining that a subset of the respective discrepancy values corresponds to the correction capability of the failed decoding operation, correcting at least one bit of the set of bits corresponding to the subset of the respective discrepancy values by switching a value of the at least one bit.

10. The method of claim 9, wherein the correction capability corresponds to a number of errors that are correctable by the failed decoding operation.

11. The method of claim 9, further comprising:
simulating switching a value of the at least one bit of the set of bits, wherein a respective discrepancy value is calculated for the at least one bit of the set of bits after simulating switching the value of the at least one bit of the set of bits.

12. The method of claim 9, wherein calculating the respective discrepancy values for the set of bits is based on outputs of the failed decoding operation.

13. The method of claim 9, wherein the failed decoding operation corresponds to the set of bits including a number of errors greater than the correction capability of the failed decoding operation.

14. The method of claim 9, wherein the segment of the memory device is represented by a plurality of rows and a plurality of columns in an array of the memory device.

15. The method of claim 14, wherein to identify the set of bits of the segment of the memory device associated with the failed decoding operation, the processing device is to perform operations further comprising:
determining that at least one row of the plurality of rows is associated with the failed decoding operation; and
determining that at least one column of the plurality of columns is associated with the failed decoding operation.

16. The method of claim 14, wherein to identify the set of bits of the segment of the memory device associated with the failed decoding operation, the processing device is to perform operations further comprising:
determining that a first status bit for a respective row of the plurality of rows is associated with the failed decoding operation; and
determining that a second status bit for a respective column of the plurality of columns is associated with the failed decoding operation, wherein identifying the set of bits of the segment of the memory device associated with the failed decoding operation is based on determining that the first status bit for the respective row and the second status bit for the respective column are associated with the failed decoding operation.

17. A non-transitory computer-readable storage medium comprising instructions that, when executed by a processing device, cause the processing device to perform operations comprising:
identifying a set of bits of a segment of a memory device associated with a failed decoding operation;
calculating respective discrepancy values for the set of bits, each respective discrepancy value corresponding to a respective bit of the set of bits;
determining whether any of the respective discrepancy values for the set of bits corresponds to a correction capability of the failed decoding operation; and
in response to determining that a subset of the respective discrepancy values corresponds to the correction capability of the failed decoding operation, correcting at least one bit of the set of bits corresponding to the subset of the respective discrepancy values by switching a value of the at least one bit.

18. The non-transitory computer-readable storage medium of claim 17, wherein the correction capability corresponds to a number of errors that are correctable by the failed decoding operation.

19. The non-transitory computer-readable storage medium of claim 17, wherein the instructions cause the processing device to perform operations further comprising:
simulating switching a value of the at least one bit of the set of bits, wherein a respective discrepancy value is calculated for the at least one bit of the set of bits after simulating switching the value of the at least one bit of the set of bits.

20. The non-transitory computer-readable storage medium of claim 17, wherein calculating the respective discrepancy values for the set of bits is based on outputs of the failed decoding operation.

* * * * *